US012795996B2

(12) United States Patent
Yang et al.

(10) Patent No.: US 12,795,996 B2
(45) Date of Patent: Nov. 10, 2026

(54) 3DSFET DEVICE INCLUDING SELF-ALIGNED SOURCE/DRAIN CONTACT STRUCTURE WITH SPACER STRUCTURE AT SIDE SURFACE THEREOF

(71) Applicant: SAMSUNG ELECTRONICS CO., LTD., Suwon-si (KR)

(72) Inventors: Myung Yang, Niskayuna, NY (US); Myunghoon Jung, Clifton Park, NY (US); Seungmin Song, Clifton Park, NY (US); Seungchan Yun, Waterford, NY (US); Sejung Park, Watervliet, NY (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 596 days.

(21) Appl. No.: 18/135,530

(22) Filed: Apr. 17, 2023

(65) Prior Publication Data

US 2024/0162309 A1 May 16, 2024

Related U.S. Application Data

(60) Provisional application No. 63/425,564, filed on Nov. 15, 2022.

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
CPC .. H10D 30/6729; H10D 30/014; H10D 30/43; H10D 30/6735; H10D 62/121;
(Continued)

(56) References Cited

U.S. PATENT DOCUMENTS 4,992,846 A * 2/1991 Sakakibara ........ H10D 30/0314 257/74
6,348,714 B1 * 2/2002 Lin .................... H10D 30/6708 438/149
(Continued)

FOREIGN PATENT DOCUMENTS

WO 2023/161760 A1 8/2023

OTHER PUBLICATIONS

Communication issued on Apr. 22, 2024 by the European Patent Office for European Patent Application No. 23207014.4.

*Primary Examiner* — Caleb E Henry
*Assistant Examiner* — Pratiksha Jayant Lohakare
(74) *Attorney, Agent, or Firm* — Myers Bigel, P.A.

(57) ABSTRACT

Provided is a three-dimensional field-effect transistor (3DS-FET) device including: a 1$^{st}$ source/drain region on a substrate, and a 2$^{nd}$ source/drain region on the 1$^{st}$ source/drain region; and a 1$^{st}$ source/drain contact structure on the 1$^{st}$ source/drain region, and a 2$^{nd}$ source/drain contact structure on the 2$^{nd}$ source/drain region, wherein the 2$^{nd}$ source/drain region is isolated from the 1$^{st}$ source/drain region through an interlayer structure, and wherein a spacer is formed at an upper portion of a sidewall of the 2$^{nd}$ source/drain contact structure, between the 1$^{st}$ source/drain contact structure and the 2$^{nd}$ source/drain contact structure.

16 Claims, 10 Drawing Sheets

(51) Int. Cl.

| | |
|---|---|
| ***H10D 30/43*** | (2025.01) |
| ***H10D 62/10*** | (2025.01) |
| ***H10D 84/01*** | (2026.01) |
| ***H10D 84/03*** | (2025.01) |
| ***H10D 84/85*** | (2025.01) |
| ***H10D 88/00*** | (2026.01) |

(52) U.S. Cl.
CPC ....... *H10D 30/6735* (2025.01); *H10D 62/121* (2025.01); *H10D 84/0186* (2025.01); *H10D 84/038* (2025.01); *H10D 84/856* (2025.01); *H10D 88/01* (2025.01)

(58) Field of Classification Search
CPC ............. H10D 84/0186; H10D 84/038; H10D 84/856; H10D 88/01; H10D 30/6757; H10D 64/251; H10D 84/83; H10D 88/00; H10D 84/013; H10D 84/0149; H10D 84/853; B82Y 10/00; H01L 21/76831; H01L 21/76897
USPC .......................................................... 257/351
See application file for complete search history.

(56) References Cited

U.S. PATENT DOCUMENTS

| | | | | |
|---|---|---|---|---|
| 6,933,590 | B2 * | 8/2005 | Yamada | H10B 12/09 257/E27.092 |
| 8,962,399 | B2 * | 2/2015 | Vinet | H10D 30/021 438/154 |
| 9,978,602 | B2 * | 5/2018 | Niebojewski | H10D 30/0323 |
| 10,192,867 | B1 * | 1/2019 | Frougier | H10D 30/014 |
| 10,734,224 | B2 | 8/2020 | Smith et al. | |
| 11,069,684 | B1 | 7/2021 | Xie et al. | |
| 11,251,308 | B2 | 2/2022 | Liao et al. | |
| 11,322,401 | B2 | 5/2022 | Smith et al. | |
| 11,532,714 | B2 | 12/2022 | Yu et al. | |
| 2016/0049516 | A1 * | 2/2016 | Huang | H10D 30/024 438/283 |
| 2017/0140933 | A1 * | 5/2017 | Lee | H10D 30/014 |
| 2017/0317079 | A1 * | 11/2017 | Kim | H10D 64/017 |
| 2017/0358500 | A1 * | 12/2017 | Lin | H10D 30/024 |
| 2018/0033797 | A1 * | 2/2018 | Colinge | B82Y 10/00 |
| 2018/0108577 | A1 * | 4/2018 | Zhu | H10D 30/797 |
| 2022/0278211 | A1 | 9/2022 | Tsai et al. | |
| 2022/0359650 | A1 | 11/2022 | Huang et al. | |

* cited by examiner

FIG. 4

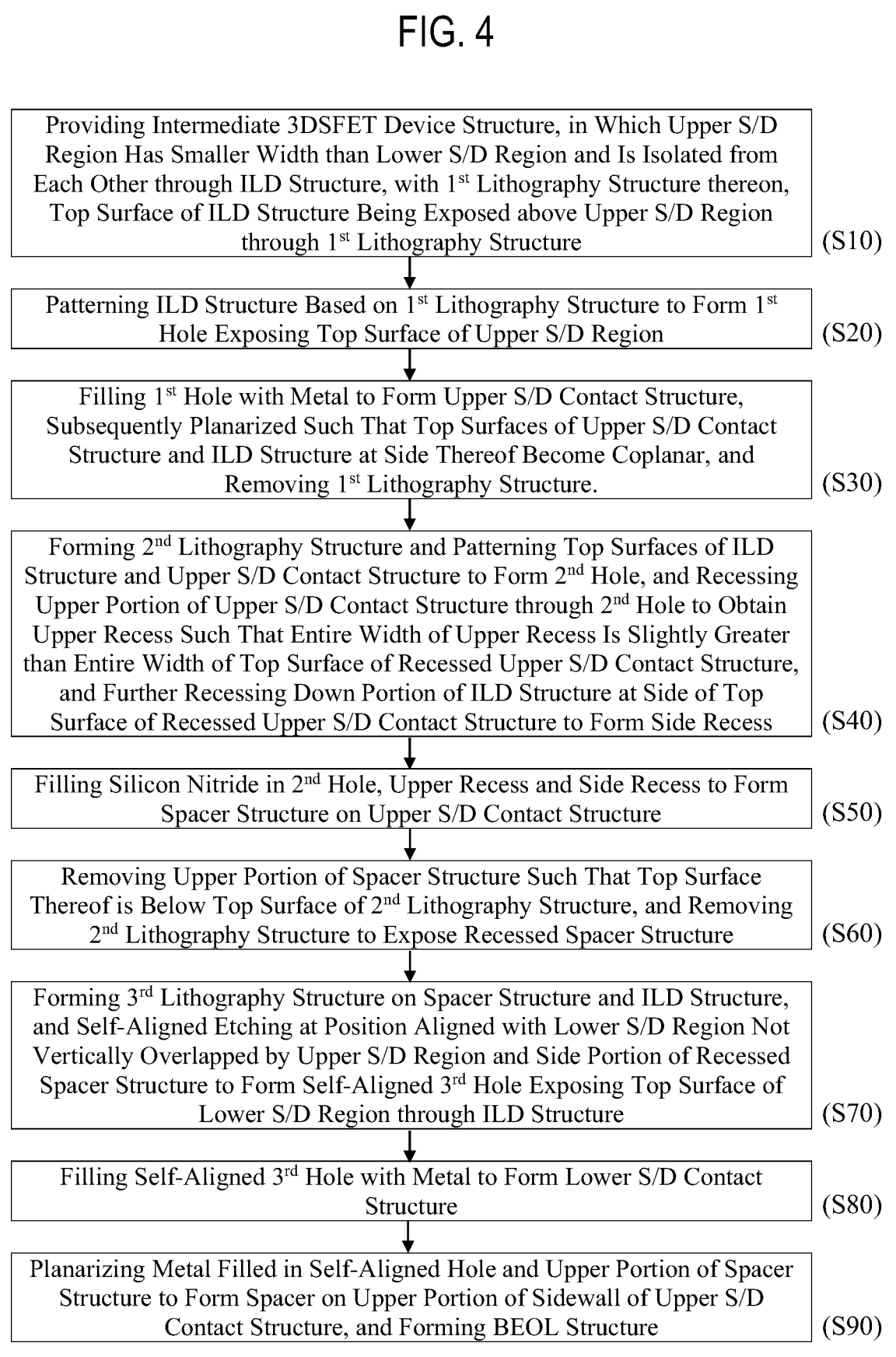

Providing Intermediate 3DSFET Device Structure, in Which Upper S/D Region Has Smaller Width than Lower S/D Region and Is Isolated from Each Other through ILD Structure, with 1st Lithography Structure thereon, Top Surface of ILD Structure Being Exposed above Upper S/D Region through 1st Lithography Structure (S10)

↓

Patterning ILD Structure Based on 1st Lithography Structure to Form 1st Hole Exposing Top Surface of Upper S/D Region (S20)

↓

Filling 1st Hole with Metal to Form Upper S/D Contact Structure, Subsequently Planarized Such That Top Surfaces of Upper S/D Contact Structure and ILD Structure at Side Thereof Become Coplanar, and Removing 1st Lithography Structure. (S30)

↓

Forming 2nd Lithography Structure and Patterning Top Surfaces of ILD Structure and Upper S/D Contact Structure to Form 2nd Hole, and Recessing Upper Portion of Upper S/D Contact Structure through 2nd Hole to Obtain Upper Recess Such That Entire Width of Upper Recess Is Slightly Greater than Entire Width of Top Surface of Recessed Upper S/D Contact Structure, and Further Recessing Down Portion of ILD Structure at Side of Top Surface of Recessed Upper S/D Contact Structure to Form Side Recess (S40)

↓

Filling Silicon Nitride in 2nd Hole, Upper Recess and Side Recess to Form Spacer Structure on Upper S/D Contact Structure (S50)

↓

Removing Upper Portion of Spacer Structure Such That Top Surface Thereof is Below Top Surface of 2nd Lithography Structure, and Removing 2nd Lithography Structure to Expose Recessed Spacer Structure (S60)

↓

Forming 3rd Lithography Structure on Spacer Structure and ILD Structure, and Self-Aligned Etching at Position Aligned with Lower S/D Region Not Vertically Overlapped by Upper S/D Region and Side Portion of Recessed Spacer Structure to Form Self-Aligned 3rd Hole Exposing Top Surface of Lower S/D Region through ILD Structure (S70)

↓

Filling Self-Aligned 3rd Hole with Metal to Form Lower S/D Contact Structure (S80)

↓

Planarizing Metal Filled in Self-Aligned Hole and Upper Portion of Spacer Structure to Form Spacer on Upper Portion of Sidewall of Upper S/D Contact Structure, and Forming BEOL Structure (S90)

3DSFET DEVICE INCLUDING SELF-ALIGNED SOURCE/DRAIN CONTACT STRUCTURE WITH SPACER STRUCTURE AT SIDE SURFACE THEREOF

CROSS-REFERENCE TO RELATED APPLICATION

This application is based on and claims priority from U.S. Provisional Application No. 63/425,564 filed on Nov. 15, 2022 in the U.S. Patent and Trademark Office, the disclosure of which is incorporated herein in its entirety by reference.

BACKGROUND

1. Field

Apparatuses and methods consistent with example embodiments of the disclosure relate to a three-dimensionally-stacked field-effect transistor (3DSFET) device including a self-aligned source/drain contact structure.

2. Description of Related Art

A 3DSFET device formed of a lower field-effect transistor (FET) and an upper FET stacked thereon has been introduced to respond to fast-growing demand for an integrated circuit having a high device density and performance. Each of the lower and upper FETs may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, or as a multi-bridge channel field-effect transistor (MBCFET).

However, the high density required for the 3DSFET device exposes various challenges including difficulties in formation of a lower source/drain contact structure and an upper source/drain contact structure on a lower source/drain region and an upper source/drain region, respectively. A 3DSFET in which an upper FET has a smaller channel width and a smaller source/drain region width than a lower FET has been developed at least to address the contact structure issue.

FIG. 1A illustrates a top plan view of a 3DSFET device in which an upper channel structure and an upper source/drain region have a smaller width than a lower channel structure and a lower source/drain region, respectively, which is a channel-width direction. FIG. 1B illustrates a channel cross-section view of the 3DSFET of FIG. 1A taken along a line I-I' shown in FIG. 1A. FIG. 1C illustrates a source/drain region cross-section view of the 3DSFET of FIG. 1A taken along a line II-II' shown in FIG. 1A.

Referring to FIGS. 1A-1C, a 3DSFET device 10 may include a lower nanosheet transistor 10L formed on a substrate 105 and an upper nanosheet transistor 10U stacked on the lower nanosheet transistor 10L. The two vertically-stacked nanosheet transistors 10L and 10U may be isolated from each other by a lower interlayer dielectric (ILD) structure 130, and respectively connected to a back-end-of-line (BEOL) of the 3DSFET device 10 including metal lines M1 and via structures V1 formed in an upper ILD structure 140. FIG. 1A does not show the metal lines M1, the via structures V1 and the upper ILD structure 140 to better show relative dispositions of other underlying structures of the 3DSFET device 10 in the top plan view.

The lower nanosheet transistor 10L may include lower source/drain regions 113A and 113B formed at both ends of a lower channel structure 110 in a D1 direction, which is a channel-length direction. The lower channel structure 110 may include a plurality of lower nanosheet layers 110N and surrounded by a lower gate structure 115. Further, a lower gate contact structure 116 and lower source/drain contact structures 114A and 114B may be formed on top surfaces of the lower gate structure 115 and the lower source/drain regions 113A and 113B, respectively, for connection of the lower nanosheet transistor 10L to a voltage source or for internal routing through the BEOL. Similarly, the upper nanosheet transistor 10U may include upper source/drain regions 123A and 123B formed at both ends of an upper channel structure 120 in the D1 direction. The upper channel structure 120 may include a plurality of upper nanosheet layers 120N and surrounded by an upper gate structure 125 isolated from the lower gate structure 115 by an isolation layer 117. An upper gate contact structure 126 and upper source/drain contact structures 124A and 124B may be formed on top surfaces of the upper gate structure 125 and the upper source/drain regions 123A and 123B, respectively, for connection of the upper nanosheet transistor 10U to a voltage source or for internal routing through the BEOL.

In the 3DSFET device 10, the upper channel structure 120 may have a smaller channel width that the lower channel structure 110, and the upper source/drain regions 123A and 123B may have a smaller width than the lower source/drain regions 113A and 113B, in a D2 direction, which is a channel-width direction, intersecting the D1 direction. Thus, as shown in FIG. 1C, the lower source/drain contact structure 114A can be vertically extended down from the BEOL to the top surface of the lower source/drain region 113A through the lower ILD structure 130 in a region where the upper source/drain region 123A does not overlap the lower source/drain region 113A. Otherwise, in case that the upper source/drain region 123A and the lower source/drain regions 113A therebelow have an equal or similar width in the D2 direction, the lower channel structure 114A may not be formed in the non-overlapping region above the top surface of the lower source/drain region 113A, and instead, may have to be formed outside the non-overlapping region to be connected to a side surface of the lower source/drain region 113A to avoid possible short-circuits between the lower source/drain contact structure 114A and the upper source/drain contact structure 124A and the upper source/drain region 123A, which increases the footprint of the 3DSFET device 10.

However, as the lower source/drain contact structure 114A and the upper source/drain contact structure 124A both are formed to be close to each other in the nano-scale footprint as shown in FIG. 1C, a distance between the lower source/drain contact structure 114A and the upper source/drain contact structure 124A and a distance between the lower source/drain contact structure 114A and the upper source/drain region 123A become more marginal. In addition, it is required to limit a distance between the lower gate contact structure 116 and the upper gate contact structure 126. Thus, the stacked structure of the 3DSFET device 10 exposes a risk of a short circuit between these structural components during formation of the 3DSFET device 10, and increases manufacturing difficulties thereof.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a 3DSFET device in which a spacer structure is formed at a sidewall of an upper source/drain contact structure.

According to an embodiment, there is provided a 3DSFET device which may include: a $1^{st}$ source/drain region on a substrate, and a $2^{nd}$ source/drain region on the $1^{st}$ source/drain region; and a $1^{st}$ source/drain contact structure on the $1^{st}$ source/drain region, and a $2^{nd}$ source/drain contact structure on the $2^{nd}$ source/drain region, wherein the $2^{nd}$ source/drain region is isolated from the $1^{st}$ source/drain region through an interlayer structure, and wherein a spacer is formed at an upper portion of a sidewall of the $2^{nd}$ source/drain contact structure, between the $1^{st}$ source/drain contact structure and the $2^{nd}$ source/drain contact structure.

According to an embodiment, the spacer may have a higher etch selectivity and a lower etch rate than the interlayer structure, and/or the spacer may have a greater dielectric constant and the interlayer structure. According to an embodiment, the spacer may include silicon nitride, and the interlayer structure may include silicon oxide.

According to an embodiment, there is provided a 3DSFET device which may include: a $1^{st}$ source/drain region on a substrate, and a $2^{nd}$ source/drain region on the $1^{st}$ source/drain region; and a $1^{st}$ source/drain contact structure on the $1^{st}$ source/drain region, and a $2^{nd}$ source/drain contact structure on the $2^{nd}$ source/drain region, wherein the $1^{st}$ source/drain contact structure is isolated from the $2^{nd}$ source/drain contact structure through an interlayer structure comprising a $1^{st}$ isolation structure formed of a dielectric material and a $2^{nd}$ isolation structure formed of another dielectric material.

According to an embodiment, there is provided a method of manufacturing a 3DSFET device. The method may include: forming an upper source/drain contact structure contacting a top surface of an upper source/drain region through an interlayer structure; forming a spacer structure on the upper source/drain contact structure such that at least a portion of the spacer structure is formed on at least an upper portion of a sidewall of the upper source/drain contact structure; forming a lithography structure on the spacer structure and the interlayer structure, and etching a side portion of the spacer structure and the interlayer structure to form a hole exposing a lower source/drain region based on the $1^{st}$ lithography structure; and filling the hole with a lower source/drain contact structure contacting a top surface of the lower source/drain region.

BRIEF DESCRIPTION OF DRAWINGS

Example embodiments of the disclosure will be more clearly understood from the following detailed description taken in conjunction with the accompanying drawings.

FIG. 4 illustrate a flowchart of a method of forming lower and upper source/drain contact structures of a 3DSFET, according to an embodiment.

DETAILED DESCRIPTION OF EMBODIMENTS

Figures 1A, 1B, 1C:
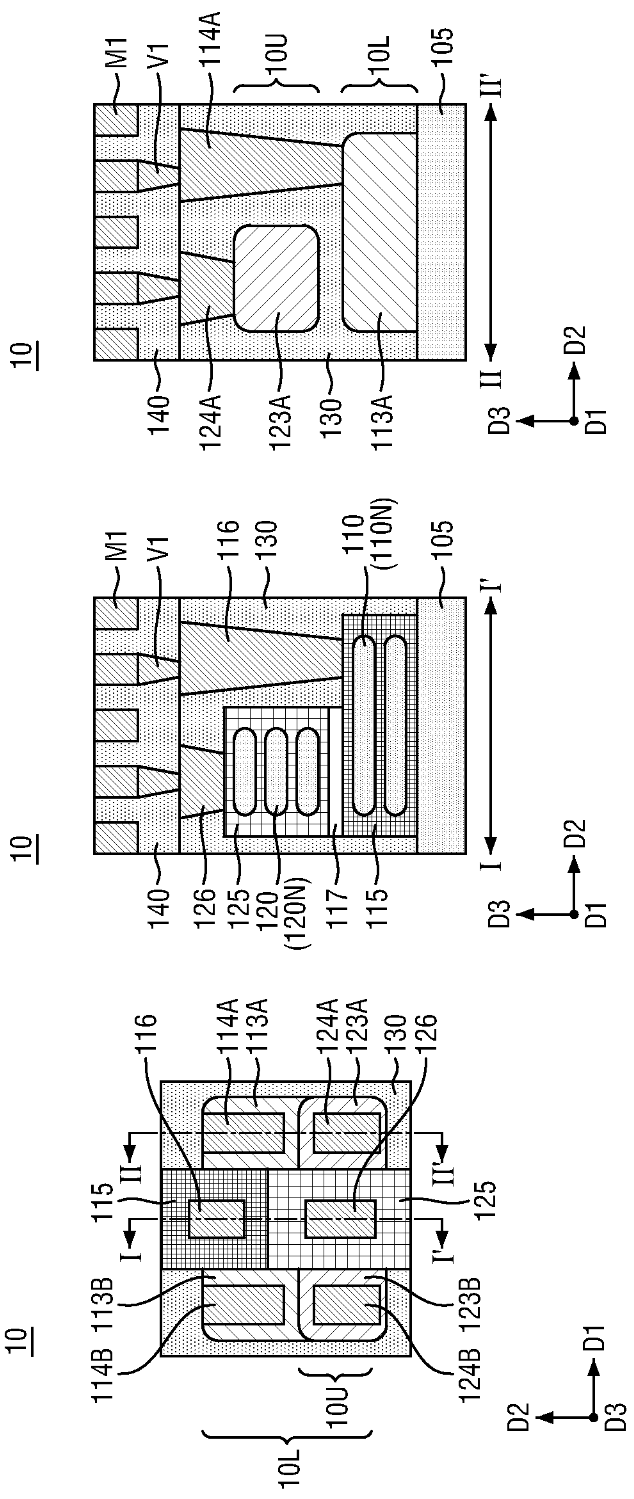
FIG. 1A illustrates a top plan view of a 3DSFET device in which an upper channel structure and an upper source/drain region have a smaller width than a lower channel structure and a lower source/drain region, respectively, which is a channel-width direction.
FIG. 1B illustrates a channel cross-section view of the 3DSFET of FIG. 1A taken along a line I-I' shown in FIG. 1A.
FIG. 1C illustrates a source/drain region cross-section view of the 3DSFET of FIG. 1A taken along a line II-II' shown in FIG. 1A.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, nanosheet sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. For example, the disclosure omits descriptions of materials of a substrate (e.g., silicon, germanium, etc.) and a source/drain region (e.g., silicon doped with p-type or n-type impurities).

Figures 2A, 2B, 2C:
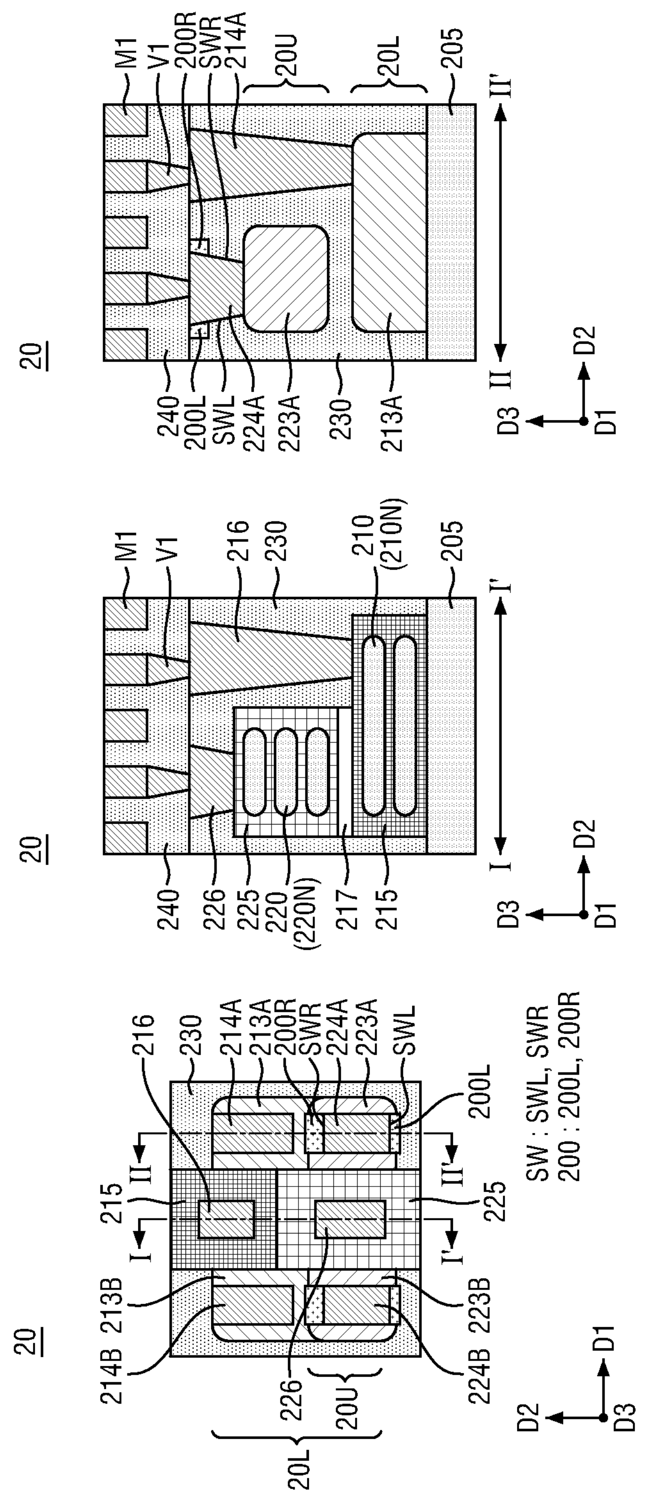
FIG. 2A illustrates a top plan view of a 3DSFET device in which an upper channel structure and an upper source/drain region have a smaller width than a lower channel structure and a lower source/drain region, respectively, according to an embodiment.
FIG. 2B illustrates a channel cross-section view of the 3DSFET of FIG. 2A taken along a line I-I' shown in FIG. 2A.
FIG. 2C illustrates a source/drain region cross-section view of the 3DSFET of FIG. 1A taken along a line II-II' shown in FIG. 2A.

FIG. 2A illustrates a top plan view of a 3DSFET device in which an upper channel structure and an upper source/drain region have a smaller width than a lower channel structure and a lower source/drain region, respectively, according to an embodiment. FIG. 2B illustrates a channel cross-section view of the 3DSFET of FIG. 2A taken along a line I-I' shown in FIG. 2A. FIG. 2C illustrates a source/drain region cross-section view of the 3DSFET of FIG. 1A taken along a line II-II' shown in FIG. 2A.

FIGS. 2A-2C illustrating a 3DSFET device 20 correspond FIGS. 1A-1C, illustrating the 3DSFET device 10, respectively.

The 3DSFET device 20 is similar to the 3DSFET device 10 in that the 3DSFET device 20 may also include vertically-stacked lower and upper nanosheet transistors 20L and 20U having different channel widths and different source/drain region widths on a substrate 205. Thus, duplicate descriptions are omitted about lower and upper channel structures 210 and 220 including nanosheet layers 210N and 220N surrounded by lower and upper gate structures 215 and 225, and connecting lower and upper source/drain regions 213A, 213B, 223A and 223B to one another, respectively. Also, metal lines M1, via structures V1, a lower ILD structure 230, and an upper ILD structure 240 may be the same as or similar to those shown in FIGS. 1A-1C, and thus, descriptions thereof are omitted herein. However, the 3DSFET device 20 may have upper source/drain contact structures different from those in the 3DSFET device 10.

According to an embodiment, each of the lower and upper nanosheet transistors 20L and 20U may be a p-type field-effect transistor or an n-type field-effect transistor. However, the disclosure is not limited thereto.

Referring to FIGS. 2A and 2C, the 3DSFET device 20 may include an upper source/drain contact structure 224A connecting the upper source/drain region 223A to a BEOL of the 3DSFET device 20 including the metal lines M1 and the via structures V1 in the upper ILD structure 240. However, unlike the upper source/drain contact structure 124A of 3DSFET device 10 shown in FIG. 1C, the upper source/drain contact structure 224A may have a spacer 200 formed at an upper portion of a sidewall SW thereof, respectively, according to an embodiment.

Figure 5A:
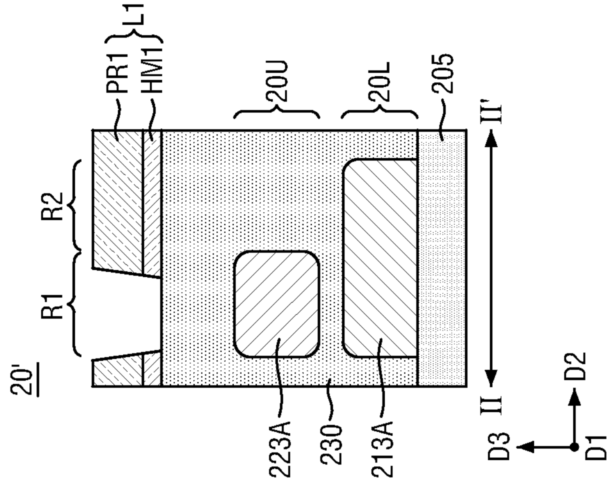
FIGS. 5A-5O illustrate intermediate 3DSFET device structures after respective operations of the method described in reference to FIG. 4 are performed, according to embodiments.
Figure 5B:
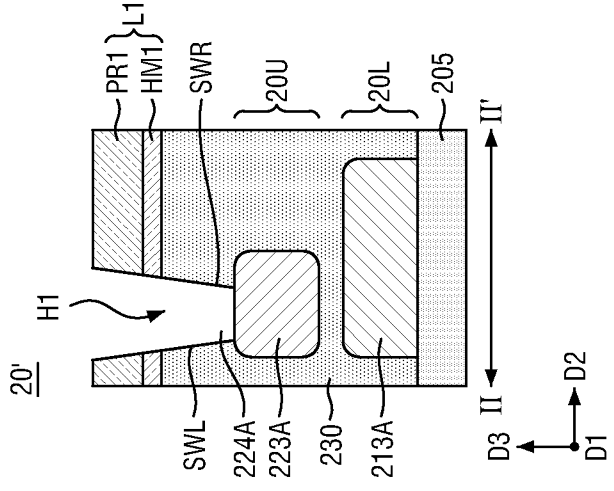
Figure 5C:
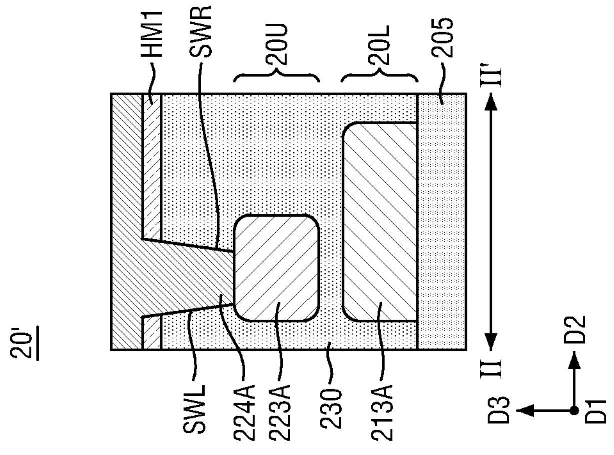
Figure 5F:
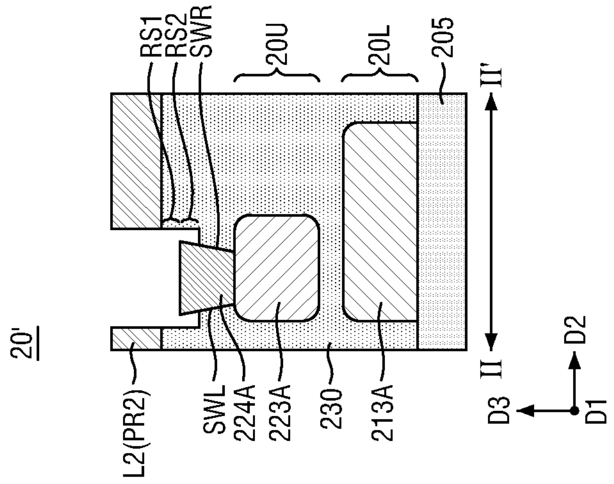
Figure 5E:
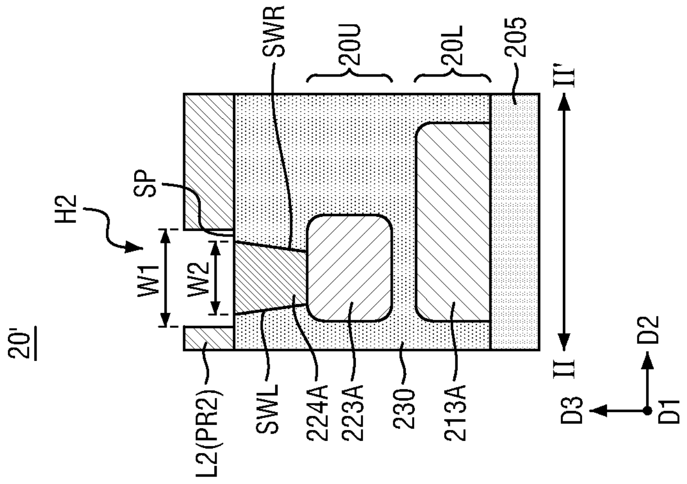
Figure 5D:
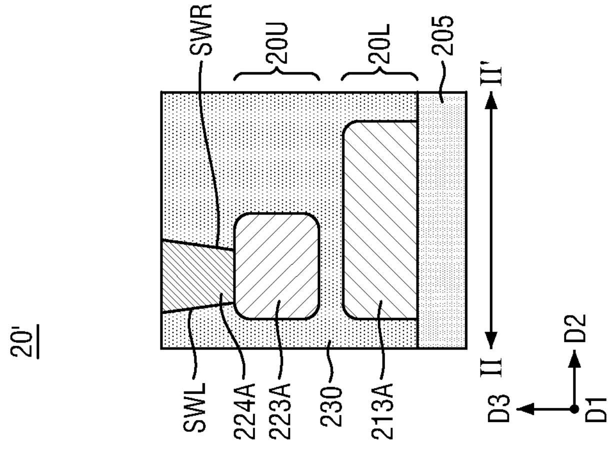
Figure 5G:
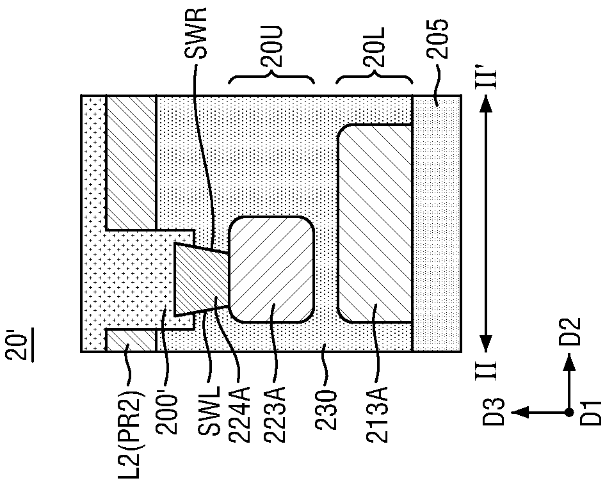
Figure 5H:
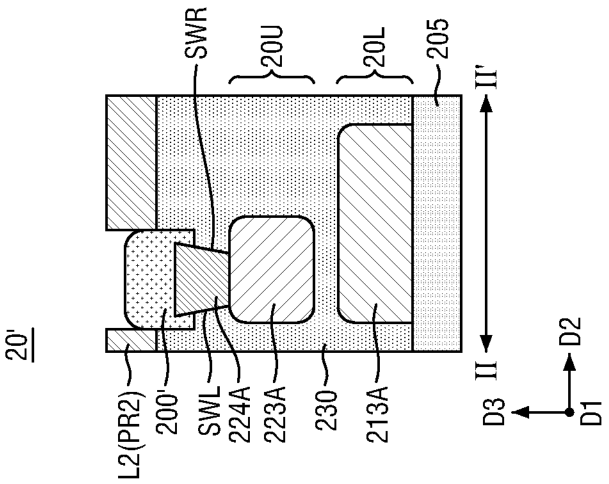
Figure 5I:
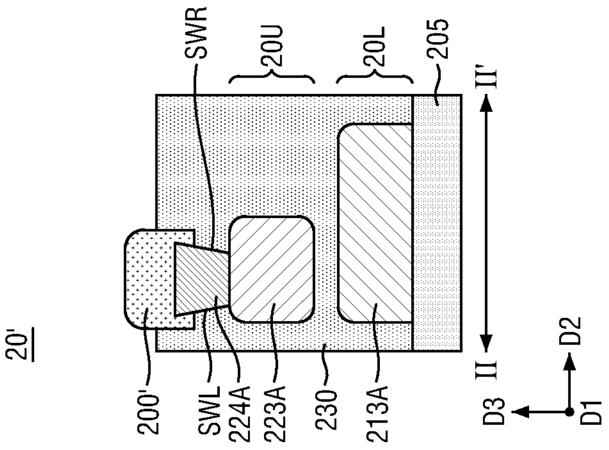
Figure 5L:
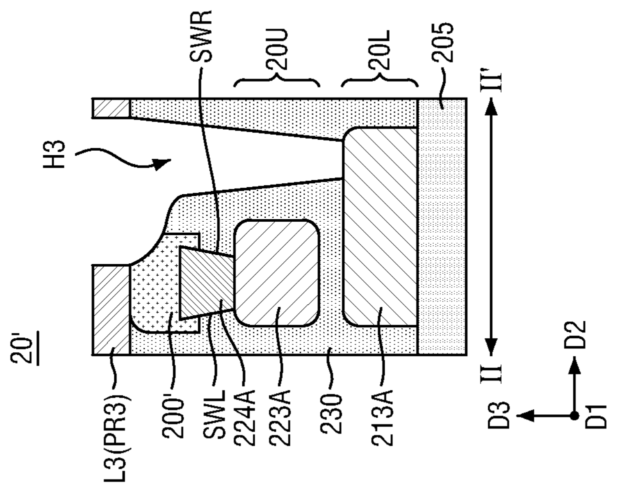
Figure 5K:
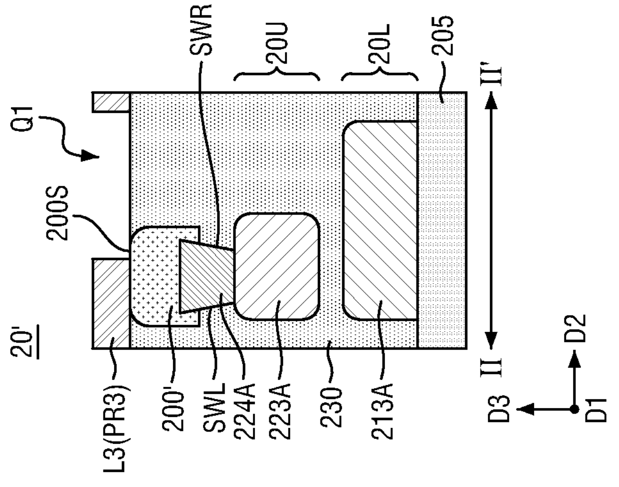
Figure 5J:
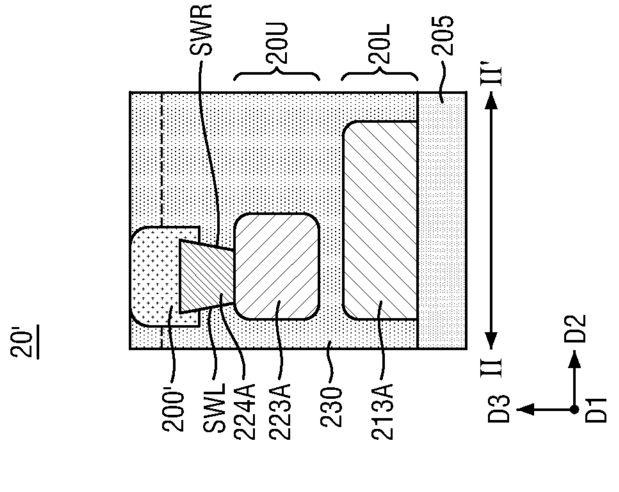
Figure 5M:
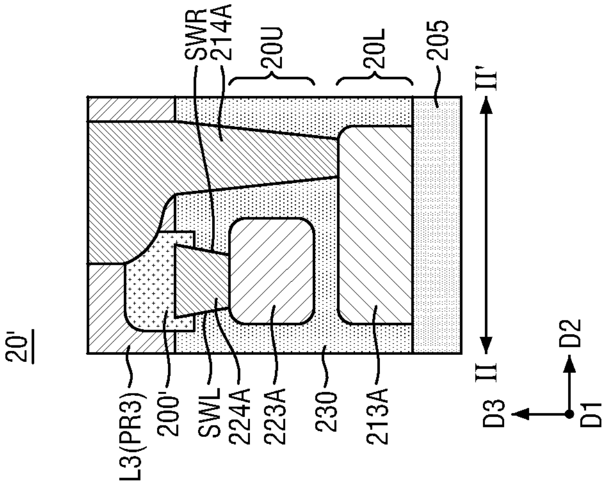
Figure 5N:
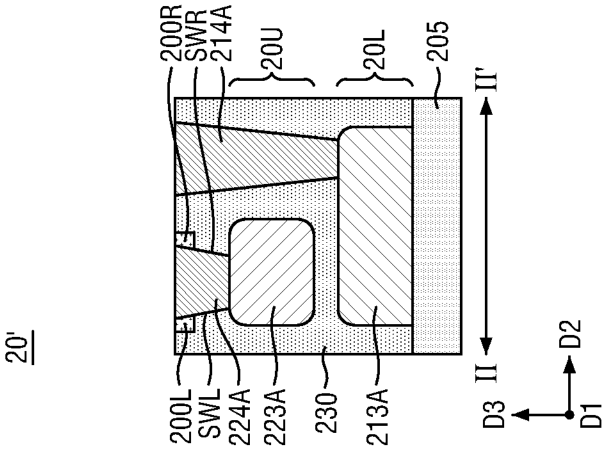
Figure 5O:
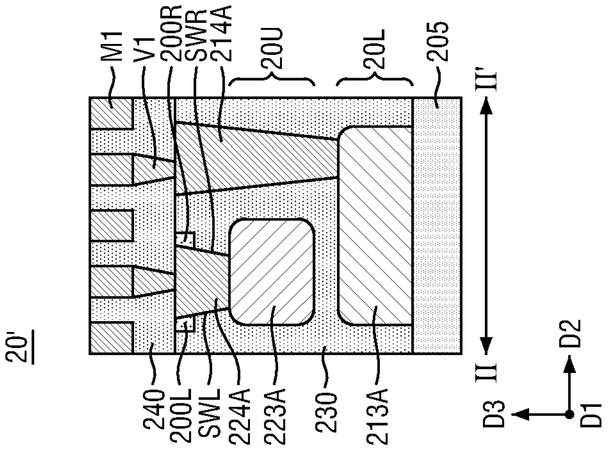

As will be described later in reference to FIGS. 5A-5O illustrating a method of forming lower and upper source/drain contact structures of a 3DSFET, the spacer 200 may be a structure remaining at the upper portions of the sidewall SW of the upper source/drain contact structure 224A in the lower ILD structure 230 after formation of the lower source/drain contact structure 214A on the lower source/drain region 213A.

According to an embodiment, the spacer 200 may be formed of a dielectric material having an etch selectivity and/or an etch rate different from the lower ILD structures 230 and 240. According to an embodiment, the dielectric material forming the spacer 200 may have a dielectric constant different from the ILD structures 230 and 240. For example, the spacer 200 may include a nitride material such as silicon nitride (e.g., SiN, $Si_3N_4$, SiCN, etc.) having a dielectric constant of about 7 or more, while each of the ILD structures 230 and 240 may be formed of a oxide material such as silicon oxide (e.g., SiO, $SiO_2$, etc.) having a dielectric constant of about 4. The nitride material forming the spacer 200 may have a lower etch rate and a higher etch selectivity than the oxide material forming the ILD structures 230 and 240 to be more resistant to etching, e.g., plasma dry etching.

Both the silicon oxide that may form the lower ILD structure 230 and the silicon nitride that may form the spacer 200 have dielectric constants sufficient to enable electrical insulation between conductive structures including the upper source/drain contact structure 224A in the 3DSFET 20. Moreover, as will be described later in reference to FIGS. 5A-5O, the spacer 200 may enable easier formation of the lower source/drain contact structure 214A with a sufficient margin between the lower source/drain contact structure 214A and the upper source/drain contact structure 224A, and between the lower source/drain contact structure 214A and the upper source/drain region 223A.

FIGS. 2A and 2C show that the spacer 200 includes a left spacer 200L and a right spacer 200R formed at upper portions of a left sidewall SWL and a right sidewall SWR of the sidewall SW of the upper source/drain contact structure 224A. However, the disclosure is not limited thereto. According to an embodiment, the spacer 200 may be a connected structure surrounding the upper portion of the sidewall SW of the upper source/drain contact structure 224A as shown in FIG. 3.

Figure 3:
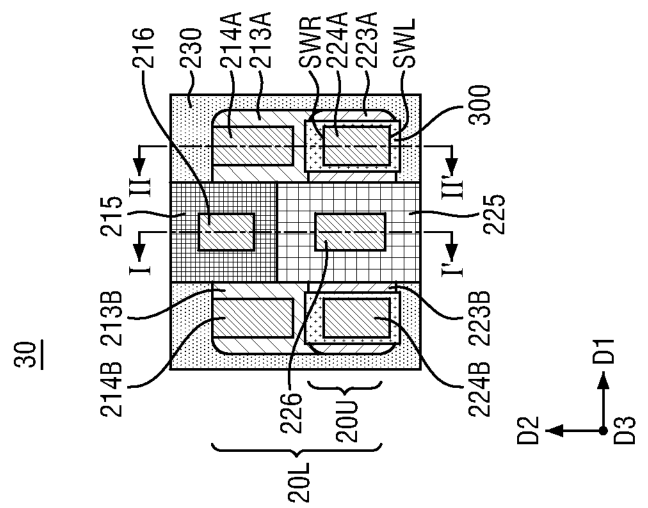
FIG. 3 illustrates a top plan view of a 3DSFET device in which an upper channel structure and an upper source/drain region have a smaller width than a lower channel structure and a lower source/drain region, respectively, according to another embodiment.

FIG. 3 illustrates a top plan view of a 3DSFET device in which an upper channel structure and an upper source/drain region have a smaller width than a lower channel structure and a lower source/drain region, respectively, according to another embodiment.

Referring to FIG. 3, a 3DSFET device 30 is the same semiconductor device structure as the 3DSFET device 20 except that a spacer 300 surrounds each of the upper source/drain contact structures 224A and 224B along each sidewall SW thereof. Like the 3DSFET device 20, the 3DSFET device 30 may also enable sufficient electrical insulation between conductive structures including the upper source/drain contact structure 224A in the 3DSFET 30. Further, the spacer 300 may enable easier formation of the lower source/drain contact structure 214A with a sufficient margin between the lower source/drain contact structure 214A and the upper source/drain contact structure 224A, and between the lower source/drain contact structure 214A and the upper source/drain region 223A.

FIG. 4 illustrate a flowchart of a method of forming lower and upper source/drain contact structures of a 3DSFET, according to an embodiment, and FIGS. 5A-5O illustrate intermediate 3DSFET device structures after respective operations of the method described in reference to FIG. 4 are performed, according to embodiments.

Herebelow, the method of forming the lower and upper source/drain contact structures 214A and 224A of the 3DSFET device 20 is described in reference to FIG. 4 and FIGS. 5A-5O which correspond to FIG. 2C. Like or the same reference numbers denote like or the same structural elements in the descriptions below in view of those shown in FIGS. 2A-2C and 3. Thus, duplicate descriptions of like or the same structure elements may be omitted herebelow.

In operation S10, an intermediate 3DSFET device structure is provided in which a lower source/drain region and an upper source/drain region having a smaller width than the upper source/drain region may be formed and isolated from each other through an ILD structure, and a $1^{st}$ lithography structure may be provided on the intermediate 3DSFET device structure such that a top surface of the ILD structure is exposed at a position vertically aligned with the upper source/drain region.

Referring to FIG. 5A, an intermediate 3DSFET device structure 20' may include the lower and upper source/drain regions 213A and 223A respectively formed for the lower and upper nanosheet transistors 20L and 20U. The lower and upper source/drain regions 213A and 223A may be electrically isolated from each other through the lower ILD structure 230. The upper source/drain region 223A may have a greater width than the lower source/drain region 213A in the D2 direction, and thus, the lower source/drain region 213A may be partially overlapped by the upper source/drain region 223A in the D3 direction. Accordingly, FIG. 5A shows that the source/drain region cross-section view of the intermediate 3DSFET device structure 20' is divided into an overlapping region R1 and a non-overlapping region R2.

A $1^{st}$ lithography structure L1 may be provided on a top surface of the lower ILD structure 230 formed of silicon oxide for a subsequent patterning operation. The $1^{st}$ lithography structure may include a $1^{st}$ hardmask layer HM1 and a $1^{st}$ photoresist pattern PR1. The $1^{st}$ hardmask layer HM1 may be formed of silicon nitride ($Si_3N_4$), and the $1^{st}$ photoresist pattern PR1 may include a plurality of layers including a light-sensitive organic polymer and silicon-containing anti-reflective coating (SiARC) layer. The $1^{st}$ hardmask layer HM1 may be patterned based on the $1^{st}$ photoresist pattern PR1 to expose the top surface of the lower ILD structure 130 at a position vertically aligned with the upper source/drain region 223A. This patterning position may correspond to the overlapping region R1.

In operation S20, the ILD structure may be patterned from top based on the $1^{st}$ lithography structure to form a $1^{st}$ hole exposing a top surface of the upper source/drain region.

Referring to FIG. 5B, the lower ILD structure 230 may be etched down from top at a position vertically above the upper source/drain region 223A based on the $1^{st}$ lithography structure L1, thereby to form a $1^{st}$ hole H1 which exposes a top surface of the upper source/drain region 223A. The etching operation may be performed through, for example, dry etching or wet etching. For the dry etching, plasma gas etching may be used.

In operation S30, the $1^{st}$ hole may be filled in with a metal or metal compound to form an upper source/drain contact structure, which is subsequently planarized such that top surfaces of the upper source/drain contact structure and the ILD structure at a side thereof become coplanar, and the $1^{st}$ lithography structure is removed.

Referring to FIG. 5C, the $1^{st}$ photoresist pattern PR1 may be removed, and the $1^{st}$ hole H1 may be filled in with a metal or metal compound which forms the upper source/drain contact structure 224A based on the $1^{st}$ hardmask layer HM1 which is patterned based on the photoresist pattern PR1. The metal or metal compound of the upper source/drain contact structure 224A may be copper (Cu), aluminum (Al), tungsten (W), ruthenium (Ru), molybdenum (Mo), etc. or their combination, not being limited thereto.

Although FIGS. 5B and 5C show that the 1$^{st}$ photoresist pattern PR1 is removed after the 1$^{st}$ hole H1 is formed, the 1$^{st}$ photoresist pattern PR1 may be removed after patterning the 1$^{st}$ hardmask layer HM1 and before the 1$^{st}$ hole H1 may be formed based on the patterned 1$^{st}$ hardmask layer HM1, according to an embodiment.

The 1$^{st}$ photoresist pattern PR1 may be removed through, for example, an ashing or stripping operation. The metal or metal compound forming the upper source/drain contact structure 224A may be filled in the 1$^{st}$ hole H1 through, for example, chemical vapor deposition (CVD), plasma enhanced CVD (PECVD), physical vapor deposition (PVD), atomic layer deposition (ALD), or a combination thereof, not being limited thereto.

Before the metal or metal compound such as copper (Cu), aluminum (Al) or tungsten (W) is filled in the 1$^{st}$ hole H1 to form the upper source/drain contact structure 224A, a barrier layer may be layered in the 1$^{st}$ hole through, for example, atomic layer deposition (ALD) to prevent the metal or metal compound from being diffused into the lower ILD structure 230, according to an embodiment, For example, a material forming the barrier layer may be titanium (Ti), titanium nitride (TiN), tantalum (Ta), tantalum nitride (TaN), etc. Thus, there may exist the barrier layer at a bottom surface and a side surface of the lower source/drain contact structure in the lower ILD structure 230. However, when ruthenium (Ru) or molybdenum (Mo) is filled in the 1$^{st}$ hole H1 to form the upper source/drain contact structure 224A, such a barrier layer may not be necessary, according to an embodiment.

Referring to FIG. 5D, after formation of the upper source/drain contact structure 224A in the 1$^{st}$ hole H1, the patterned 1$^{st}$ hardmask layer HM1 may be removed by ashing or stripping and the 1$^{st}$ upper source/drain contact structure 224A may be planarized through, for example, chemical-mechanical polishing (CMP) so that a top surface of the lower ILD structure 230 and a top surface of the upper source/drain contact structure 224A may be coplanar.

In operation S40, a 2$^{nd}$ lithography structure may be formed and patterned on the top surfaces of the ILD structure and the upper source/drain contact structure to form a 2$^{nd}$ hole, and an upper portion of upper source/drain contact structure may be recessed through the 2$^{nd}$ hole to obtain an upper recess therebelow such that an entire width of the upper recess is slightly greater than an entire width of a top surface of the recessed upper source/drain contact structure in a channel-width direction, and a portion of the ILD structure at a side of the top surface of the recessed upper source/drain contact structure may be further recessed down to form a side recess.

Referring to FIG. 5E, a 2$^{nd}$ lithography structure L2 including a 2$^{nd}$ photoresist pattern PR2 may be formed on the top surfaces of the upper source/drain contact structure 224A and the lower ILD structure 230 surrounding the upper source/drain contact structure 224A in a plan view, and the 2$^{nd}$ lithography structure L2 may be patterned to expose the top surface of the upper source/drain contact structure 224A through a 2$^{nd}$ hole H2 based on the 2$^{nd}$ photoresist pattern PR2. The 2$^{nd}$ hole H2 may have a width W1 in the D2 direction.

In the present embodiment, the 2$^{nd}$ lithography structure L2 might not include a hardmask layer such as the hardmask layer HM1 is included in the 1$^{st}$ lithography structure L1 because a subsequent operation to be performed based on the 2$^{nd}$ lithography structure L2 may be a simple patterning or etching step based on a large difference in etch selectivity and etch rate to be described herebelow.

According to an embodiment, the 2$^{nd}$ lithography structure L2 may be patterned such that an entire width W2 of the top surface of the upper source/drain contact structure 224A in the D2 direction is exposed through the 2$^{nd}$ hole H2 having the width W1, and further, a side portion SP of the top surface of the lower ILD structure 230 at a side of the upper source/drain contact structure 224A in the D2 direction may also be exposed through the 2$^{nd}$ hole H2.

Referring to FIG. 5F, based on the 2$^{nd}$ lithography structure L2 including the 2$^{nd}$ photoresist pattern PR2, an upper portion of the upper source/drain contact structure 224A along with an upper portion of the lower ILD structure 230 at the side portion SP may be etched down to a 1$^{st}$ predetermined depth to form an upper recess RS1. At this time, the lower ILD structure 230 may be further etched down at the side portion SP by a 2$^{nd}$ predetermined depth to form a side recess RS2. This etching depth difference may be caused by a difference in etch selectivity and/or etch rate between the materials forming the upper source/drain contact structure 224A and the lower ILD structure 230 with respect to a given etchant such as fluorine-based gases (e.g., CF4, SF6, etc.) used for dry etching or wet etching applied to form the upper recess RS1 and the side recess RS2. The silicon oxide forming the lower ILD structure 230 may have a higher etch rate than the metal or metal compound forming the upper source/drain contact structure 224A which is less resistant to the given etchant. For example, in a plasma etching process using a mixture of carbon tetrafluoride ($CF_4$) and oxygen ($O_2$) gases, the etch selectivity of silicon oxide to a metal or metal compound can be as high as 100:1 or more. Thus, the side recess RS2 may be formed such that a bottom of the side recess RS2 is at a lower level than a bottom of the upper recess RS1 which is coplanar with a top surface of the recessed upper source/drain contact structure 224A.

When the side portion SP is etched, the barrier layer if formed at the side surface of the upper source/drain contact structure 224A in the operation of FIG. 5C, the barrier layer may also be etched by the 1$^{st}$ and 2$^{nd}$ predetermined depths, or may remain, according to embodiments. In the description herebelow, it is assumed that the barrier layer, if any, may also be removed by the etching performed in the present operation.

As described earlier, the etching on the upper source/drain contact structure 224A and the lower ILD structure 230 performed based on the 2$^{nd}$ lithography structure L2 in the present operation may not include a hardmask layer such as the hardmask pattern HM1 included in the 1$^{st}$ lithography structure L1 in the previous operations. However, according to an embodiment, the 2$^{nd}$ lithography structure L2 may also include a similar hardmask layer for more accurate etching or patterning.

Although FIG. 5F shows that two side recesses RS2 are formed at two sides of the upper source/drain contact structure 224A, the side recesses RS2 may take a form of surrounding the upper source/drain contact structure 224A in a plan view depending on a shape and a position of the 2$^{nd}$ hole H2, according to an embodiment.

In operation S50, silicon nitride may be filled in the 2$^{nd}$ hole, the upper recess and the side recess to form a spacer structure on the upper source/drain contact structure.

Referring to FIG. 5G, silicon nitride may be filled in the 2$^{nd}$ hole H2, the upper recess RS1 and the side recess RS2 based on the patterned 2$^{nd}$ lithography structure L2 through, for example, CVD, PECVD, PVD, ALD, or a combination thereof, not being limited thereto, to form a spacer structure 200' on the upper source/drain contact structure 224A.

In operation S60, an upper portion of the spacer structure may be recessed such that a top surface thereof is below a top surface of the 2$^{nd}$ lithography structure, and the 2$^{nd}$ lithography structure may be removed to expose the recessed spacer structure.

Referring to FIG. 5H, the silicon nitride forming the spacer structure 200' may be recessed from top through, for example, dry etching such that a top surface of the recessed spacer structure 200' may be lower than a top surface of the 2nd lithography structure L2. At this time, a top edge portion or a top perimeter of the spacer structure 200' may have a rounded-edge form per characteristics of the dry etching, according to an embodiment. This is because, when the spacer structure 200' formed of silicon nitride (e.g., SiN) is etched, a portion of the spacer structure 200' contacting the 2nd lithography structure L2 may be etched down faster than the other portion of the spacer structure 200'.

Referring to FIG. 5I, the 2$^{nd}$ lithography structure L2 may be removed through, for example, ashing or stripping, to expose the recessed spacer structure 200' and the top surface of the lower ILD structure 230. At this time, the spacer structure SP may have a form of protrusion protruding from the top surface of the lower ILD structure 230.

Referring to FIG. 5J, after the removal of the 2$^{nd}$ lithography structure L2, an additional ILD material may be added on the lower ILD structure 230 such that the top surface of the lower ILD structure 230 is coplanar with the top surface of the recessed spacer structure 200', according to an embodiment. The additional ILD material may be added through, for example, CVD, PECVD, PVD, or a combination thereof, using another lithography structure on the recessed spacer structure 200', not being limited thereto In operation S70, a 3$^{rd}$ lithography structure is formed on the spacer structure and the ILD structure, and self-aligned etching is performed at a position aligned with the lower source/drain region not vertically overlapped by the upper source/drain region and a side portion of the recessed spacer structure based on the 3$^{rd}$ lithography structure to form a self-aligned 3$^{rd}$ hole exposing a top surface of the lower source/drain region through the ILD structure.

Referring to FIG. 5K, a 3$^{rd}$ lithography structure L3 including a 3$^{rd}$ photoresist pattern PR3 may be formed on the spacer structure 200', which is recessed in the previous operation described in reference to FIG. 5J, and the top surface of the lower ILD structure 230, followed by patterning the 3$^{rd}$ lithography structure L3.

Similar to the 2$^{nd}$ lithography structure L2 used in the etching step performed in the previous operation, the 3$^{rd}$ lithography structure L3 may also not include a hardmask layer for subsequent etching steps. However, according to an embodiment, the 3$^{rd}$ lithography structure L3 may also include a hardmask layer for more accurate etching or patterning.

According to an embodiment, the 3$^{rd}$ lithography structure L3 may be patterned to form an opening O1 which exposes a side portion 200S of the top surface of the spacer structure 200' in addition to the top surface of the lower ILD structure 230 at the non-overlapping region R2. According to an embodiment, a width of the opening O1 in the D2 direction may be formed to be greater than a width of the lower source/drain contact structure 214A to be formed on the lower source/drain region 213A in a later step. Thus, the wide opening O1 may be obtained in a relatively easy manner considering the nano-scale footprint of the intermediate 3DSFET device structure 20'.

Referring to FIG. 5L, the lower ILD structure 230 with the additional ILD material thereon and the side portion 200S of the spacer structure 200' may be etched down to form a 3$^{rd}$ hole H3 exposing the lower source/drain region 213A including a top surface thereof, based on the 3$^{rd}$ lithography structure L3 including the patterned 3$^{rd}$ photoresist pattern PR3.

According to an embodiment, the 3$^{rd}$ hole H3 may take a self-aligned form such that the 3$^{rd}$ hole at an upper portion above the top surface of the upper source/drain contact structure 224A has a greater width than a lower portion thereof. The 3$^{rd}$ hole H3 may take a form in which the width thereof decreases at a left side of the 3$^{rd}$ hole H3 in a downward direction. This self-aligned form may be obtained due to the difference in etch selectivity and/or etch rate between the silicon nitride forming the spacer structure 200' and silicon oxide forming the lower ILD structure 230. The silicon nitride may have a lower etch rate and a higher etch selectivity than the silicon oxide to be more resistant to etching, e.g., plasma dry etching. For example, in a plasma etching process using a mixture of carbon tetrafluoride ($CF_4$) and oxygen ($O_2$) gases, the etch selectivity of silicon oxide to silicon nitride can be as high as 10:1 or more.

Due to the relatively-wider opening O1 in the 3$^{rd}$ lithography structure L3, the 3$^{rd}$ hole H3 exposing the lower source/drain region 213A through a wider upper portion may be easily formed in a self-aligned form, according to an embodiment.

In operation S80, the self-aligned 3$^{rd}$ hole may be filled in with a metal or metal compound to form a lower source/drain contact structure.

Referring to FIG. 5M, the self-aligned 3$^{rd}$ hole H3 may be filled in with a metal or metal compound to form the lower source/drain contact structure 214A contacting the lower source/drain region 213A including a top surface thereof, followed by removal of the 3$^{rd}$ lithography structure L3 through, for example, ashing or stripping. The metal or metal compound forming the lower source/drain contact structure 214A may be the same as that forming the upper source/drain contact structure 224A. Before the 3$^{rd}$ hole H3 is filled in with the metal or metal compound to form the lower source/drain contact structure 214A, a barrier layer may be layered to prevent diffusion of the metal or metal compound in the lower ILD structure 230 depending on the type of the material or metal compound, according to embodiments, as in the operation of forming the upper source/drain contact structure 224A as shown in FIG. 5C.

In this operation, the self-aligned 3$^{rd}$ hole H3 formed based on the spacer structure 200' may enable the lower source/drain contact structure 214A to be formed such that a sufficient margin is obtained between the lower source/drain contact structure 214A and the upper source/drain region 223A, and between the lower source/drain contact structure 214A and the upper source/drain contact structure 224A.

In operation 590, the metal or metal compound filled in the self-aligned hole and an upper portion of the spacer structure may be palanarized to form a spacer at an upper portion of a sidewall of the upper source/drain contact structure, and a BEOL structure is formed for connecting the lower and upper source/drain contact structures to a voltage source or for internal routing.

Referring to FIG. 5N, the metal or metal compound filled in the self-aligned hole H3 and an upper portion of the spacer structure 200' may be palanarized through, for example, CMP to form the spacer 200 at an upper portion of the sidewall SW of the upper source/drain contact structure 224A.

According to an embodiment, the spacer 200 may include the left spacer 200L and the right spacer 200R formed at the upper portions of the left sidewall SWL and the right sidewall SWR of the sidewall SW of the upper source/drain contact structure 224A. However, the spacer 200 may be a connected structure surrounding the upper portion of the sidewall SW of the upper source/drain contact structure 224A as shown in FIG. 3.

Although the left spacer 200L and the right spacer 200R are shown to have a same or substantially same size or shape in FIG. 5N, the right spacer 200R may be formed to be greater or wider than the left spacer 200L, according to an embodiment. For example, in the operation described above in reference to FIG. 5E, the $2^{nd}$ lithography structure L2 may be patterned such that the side portion SP at a right side may be greater than the side portion SP at a left side. Then, the spacer structure 200' formed in the subsequent operations may have a greater width at a right side than a left side with respect to the upper source/drain contact structure 224A. As a result, the self-aligned $3^{rd}$ hole H3 formed based on the spacer structure 200' and the lower source/drain contact structure 214A formed therein may be able to provide a greater margin, than as shown in FIG. 5N, between the lower source/drain contact structure 214A and the upper source/drain contact structure 223A, and between the lower source/drain contact structure 214A and the upper source/drain contact structure 224A. Thus, the right spacer 200R may have a greater size or width than the left spacer 200L unlike as shown in FIG. 5N, according to an embodiment.

Referring to FIG. 5O, the BEOL structure including the upper ILD structure 240, the metal lines M1 and the via structures V1 may be formed on the planarized intermediate 3DSFET device structure 20' to form the 3DSFET device structure 20 shown in FIGS. 2A-2C.

In the above embodiments of manufacturing a 3DSFET device, a spacer structure is formed at a sidewall of an upper source/drain contact structure to allow easy self-aligned formation of an adjacent lower source/drain contact structure and provide a sufficient margin between the lower source/drain contact structure and an upper source/drain region, and between the lower source/drain contact structure and an upper source/drain contact structure. However, the disclosure is not limited thereto.

According to an embodiment, the spacer structure may be formed at a sidewall of the lower source/drain contact structure to allow easy self-aligned formation of an adjacent upper source/drain contact structure and provide a sufficient margin between the upper source/drain contact structure and a lower source/drain region, and between the upper source/drain contact structure and a lower source/drain contact structure.

According to an embodiment, a similar spacer structure may be formed at a sidewall of one of an upper gate structure and a lower gate structure to allow easy self-aligned formation of the other of the upper gate structure and the lower gate structure and provide a sufficient margin between one of the upper gate structure and the lower gate structure and the other of the upper gate structure and the lower gate structure, and between one of the upper gate structure and the lower gate structure and one of an upper gate structure and a lower gate structure.

Figure 6:
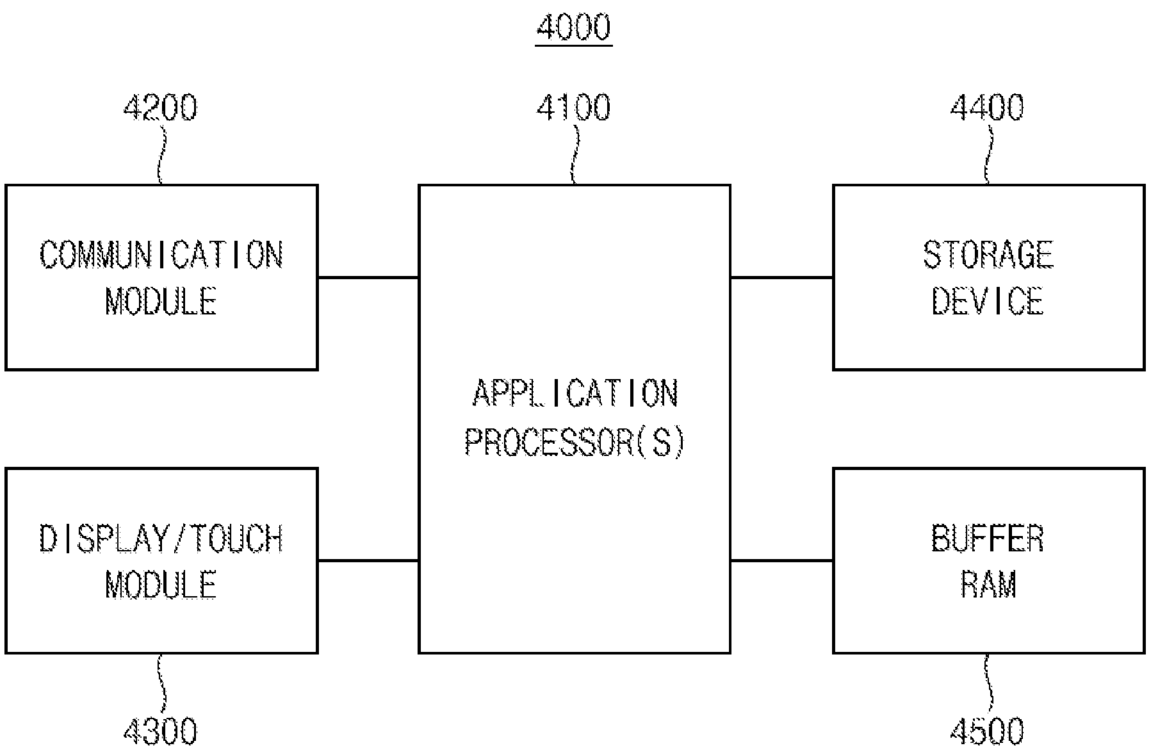
FIG. 6 is a schematic block diagram illustrating an electronic device including a 3DSFET device 20 or 30 shown in FIGS. 2A-2C or FIG. 3, respectively, according to an example embodiment.

FIG. 6 is a schematic block diagram illustrating an electronic device including a 3DSFET device 20 or 30 shown in FIGS. 2A-2C or FIG. 3, respectively, according to an example embodiment.

Referring to FIG. 6, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 6, the electronic device 4000 may further include at least one sensor such as an image sensor.

At least one component in the electronic device 4000 may include the 3DSFET device 20 or 30 shown in FIGS. 2A-2C or FIG. 3, respectively.

In the above embodiments, the 3DSFET devices 20 and 30 are described as being formed of nanosheet field-effect transistors at lower and upper stacks. However, the disclosure is not limited thereto, and at least one of the lower and upper field-effect transistors of the 3DSFET device 20 or 30 may be implemented by a fin field-effect transistor (FinFET) or another type of field-effect transistor.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A three-dimensional field-effect transistor (3DSFET) device comprising:

a $1^{st}$ source/drain region on a substrate, and a $2^{nd}$ source/drain region on the $1^{st}$ source/drain region; and a $1^{st}$ source/drain contact structure on the $1^{st}$ source/drain region, and a $2^{nd}$ source/drain contact structure on the $2^{nd}$ source/drain region, wherein the $2^{nd}$ source/drain region is isolated from the $1^{st}$ source/drain region through an interlayer structure, wherein a spacer is formed on an upper portion of a sidewall of the $2^{nd}$ source/drain contact structure, between the $1^{st}$ source/drain contact structure and the $2^{nd}$ source/drain contact structure;

wherein the interlayer structure separates the $1^{st}$ source/drain contact structure from the $2^{nd}$ source/drain contact structure in a direction parallel to a surface of the substrate, and wherein the $1^{st}$ source/drain region does not overlap the $1^{st}$ source/drain contact structure in a direction parallel to the substrate and the $2^{nd}$ source/drain region does not overlap the $2^{nd}$ source/drain contact structure in the direction parallel to the substrate.

2. The 3DSFET device of claim 1, wherein the spacer has an etch selectivity against the interlayer structure.

3. The 3DSFET device of claim 2, wherein the spacer has a lower etch rate than the interlayer structure with respect to a same etchant.

4. The 3DSFET device of claim 1, wherein the spacer comprises silicon nitride, and the interlayer structure comprises silicon oxide.

5. The 3DSFET device of claim 1, wherein the spacer comprises a left spacer and a right spacer formed on a left sidewall and a right sidewall of the $2^{nd}$ source/drain contact structure, respectively, and wherein one of the left spacer and the right spacer is formed between the $1^{st}$ source/drain contact structure and the $2^{nd}$ source/drain contact structure.

6. The 3DSFET device of claim 5, wherein the spacer has an etch selectivity against the interlayer structure.

7. The 3DSFET device of claim 6, wherein the spacer has a lower etch rate than the interlayer structure with respect to a same etchant.

8. The 3DSFET device of claim 5, wherein the spacer comprises silicon nitride, and the interlayer structure comprises silicon oxide.

9. The 3DSFET device of claim 1, wherein the spacer surrounds the upper portion of the sidewall of the $2^{nd}$ source/drain contact structure.

10. The 3DSFET device of claim 9, wherein the spacer has an etch selectivity against the interlayer structure.

11. A device comprising:

a lower source/drain region of a three-dimensional field-effect transistor (3DSFET), and an upper source/drain region of the 3DSFET;

a $1^{st}$ contact structure on the lower source/drain region and connecting the 3DSFET to a voltage source or another circuit element; and a $2^{nd}$ contact structure on the upper source/drain region and connecting the 3DSFET to the voltage source or still another circuit element, and isolated from the $1^{st}$ contact structure though an interlayer structure, wherein the $1^{st}$ contact structure comprises a spacer formed on a sidewall thereof, and wherein the spacer is formed of a dielectric material different from a material forming the interlayer structure;

wherein the 3DSFET is on a substrate and the interlayer structure separates the $1^{st}$ contact structure from the $2^{nd}$ contact structure in a direction parallel to a surface of the substrate, and wherein the lower source/drain region does not overlap the $1^{st}$ contact structure in a direction parallel to the substrate and the upper source/drain region does not overlap the $2^{nd}$ contact structure in the direction parallel to the substrate.

12. The device of claim 11, wherein the spacer is formed on an upper portion of the sidewall of the $2^{nd}$ contact structure.

13. The device of claim 11, wherein the spacer has an etch selectivity against the interlayer structure.

14. The device of claim 11, wherein the spacer has a greater dielectric constant than the interlayer structure.

15. The device of claim 11, wherein the $1^{st}$ contact structure is a lower source/drain contact structure, and the $2^{nd}$ contact structure is an upper source/drain contact structure.

16. The device of claim 11, wherein the spacer comprises silicon nitride and the interlayer structure comprises silicon oxide.

* * * * *